United States Patent [19]

White, Jr.

[11] 4,330,851

[45] May 18, 1982

[54] DYNAMIC DECODER INPUT FOR SEMICONDUCTOR MEMORY

[75] Inventor: Lionel S. White, Jr., Houston, Tex.

[73] Assignee: Texas Instruments Incorporated, Dallas, Tex.

[21] Appl. No.: 133,377

[22] Filed: Mar. 21, 1980

[51] Int. Cl.³ .............................................. G11C 11/40
[52] U.S. Cl. .................................... 365/202; 365/174
[58] Field of Search ........................ 365/174, 183, 202

[56] References Cited

U.S. PATENT DOCUMENTS

4,042,915 8/1977 Reed .................................... 365/202
4,061,999 12/1977 Proebsting et al. ................ 365/202

Primary Examiner—Terrell W. Fears
Attorney, Agent, or Firm—John G. Graham

[57] ABSTRACT

A decoder for address inputs to a semiconductor memory or the like comprises a NOR gate having a number of parallel input transistors corresponding to the number of address bits to be decoded. The address bits and their complements are selectively connected to the gates of the input transistors and the sources of these transistors, rather than only to the gates as in prior decoders. The layout of this decoder more nearly matches the pitch of rows in a high density dynamic RAM.

10 Claims, 30 Drawing Figures

DYNAMIC DECODER INPUT FOR SEMICONDUCTOR MEMORY

BACKGROUND OF THE INVENTION

This invention relates to semiconductor memory devices and more particularly to a dynamic decoder for an MOS random access memory.

The most widely used semiconductor memory devices at present are dynamic memories as described in U.S. Pat. No. 3,940,747, issued Feb. 24, 1976 to Kuo and Kitagawa, assigned to Texas Instruments. Higher density versions of these dynamic memory systems are shown in Electronics, May 13, 1976, pp. 81-86 and U.S. Pat. No. 4,081,701 issued Mar. 28, 1978 to White et al assigned to Texas Instruments. These high density devices use one-transistor dynamic memory cells which have the advantage of very small size, and thus low cost. As the density increases from 4K up through 16K, 64K and 256K-bit devices, the spacing between rows (called pitch) becomes much smaller so the amount of room allowed for the row decoder becomes less and the design of the decoder becomes more stringent. Prior decoders for connecting a row address to a one of N address for the array are shown in U.S. Pat. Nos. 4,074,237, 4,061,999, and 4,042,915, for example. The prior decoders have had disadvantages in requiring too much room in layout and placing stringent requirements on the input signals with respect to false excursims of signal before they settle out or with respect to timing.

It is a principal object of this invention to provide a dynamic decoder which does not place stringent requirements on address input signal timing and false levels, and which in layout matches the pitch of rows in a dynamic RAM of high density.

SUMMARY OF THE INVENTION

In accordance with an embodiment of this invention, a memory device is provided which includes a decoder for address inputs wherein a NOR gate has a number of parallel input transistors corresponding to the number of address bits to be decoded. The address bits and their complements are selectively connected to the gates of the input transistors and the sources of these transistors, rather than only to the gates as in prior decoders. The layout of this decoder more nearly matches the pitch of rows in a high density dynamic RAM.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows:

DETAILED DESCRIPTION OF SPECIFIC EMBODIMENT

The Memory System

Figure 1:
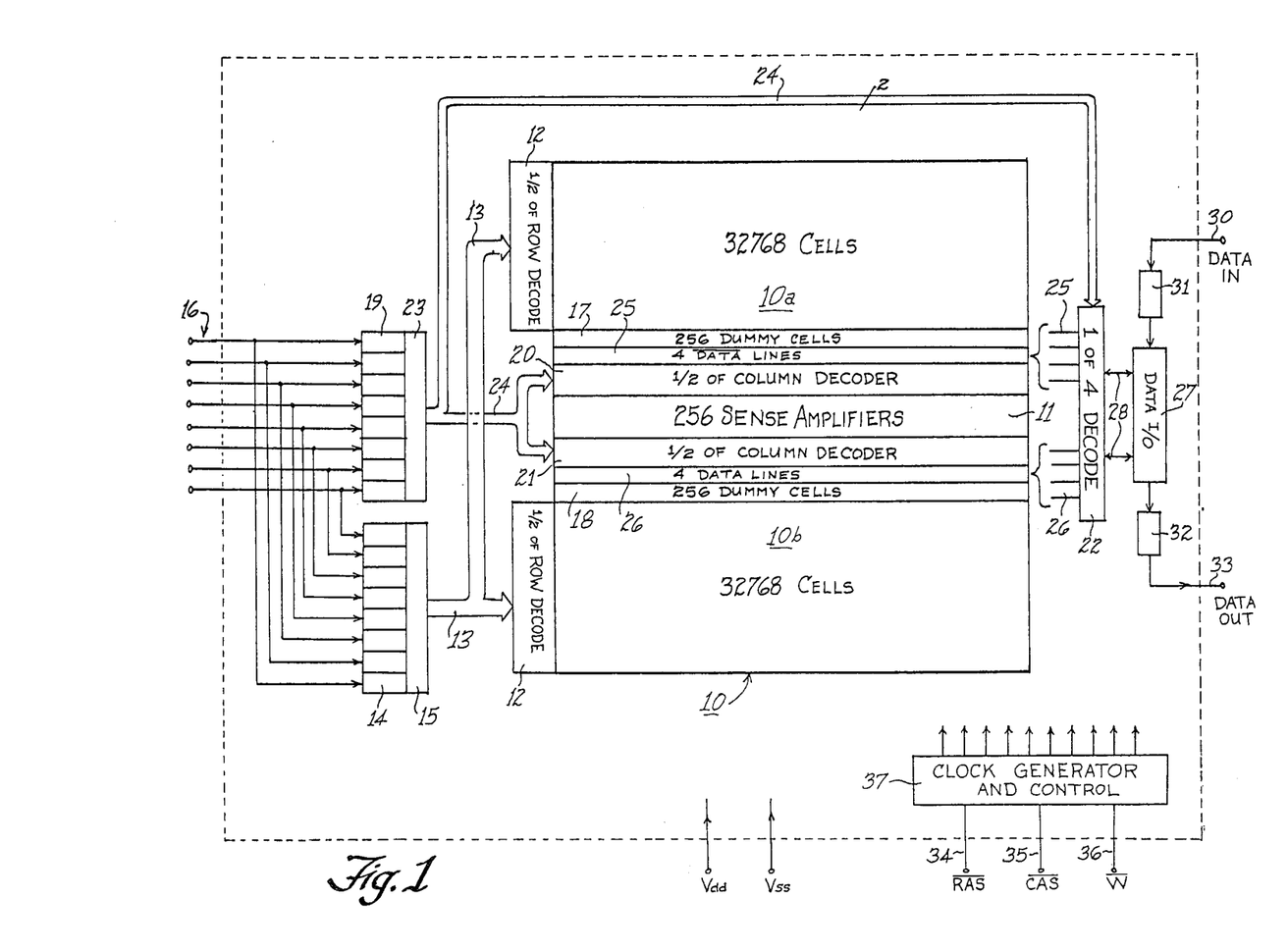
FIG. 1 is an electrical diagram in block form of a semiconductor dynamic memory device which may use the negative undershoot protection circuits of the invention as its inputs.

Referring to FIG. 1, a memory device which may utilize features of the invention in its input circuits is illustrated in block diagram form. This is a random access, read/write memory of the dynamic type, made by an N-channel, self-aligned, silicon gate, double-level polysilicon, MOS process. All of the memory device of FIG. 1 is included in one silicon chip of about 1/30 of a square inch in size which usually would be mounted in a standard dual-in-line package having sixteen pins or terminals. The device includes in this example an array 10 of 65,536 memory cells, with the array split into two halves 10a and 10b of 32,768 cells each, in a regular pattern of 256 rows and 256 columns. Of the 256 row or X lines, there are 128 in the array half 10a and 128 in the half 10b. The 256 column or Y lines are each split in half with one half of each column line being in each of the halves 10a and 10b. There are 256 sense amplifiers 11 in the center of the array; these are differential type bistable circuits made according to the invention disclosed and claimed in U.S. patent application Ser. No. 944,822, filed Sept. 22, 1978 and assigned to Texas Instruments. Each sense amplifier is connected in the center of a column line, so 128 memory cells are connected to each side of each sense amplifier by a column line half. The chip requires only a single +5 V Vdd supply, along with a ground terminal Vss. No internal charge pump is needed because no substrate bias is employed.

A row or X address decoder 12, split into two halves, is connected by sixteen A and $\bar{A}$ lines 13 to eight address buffers or latches 14 via output circuits 15. The buffers 14 have inputs which use the features of the invention as described in detail below. An eight-bit X address at TTL voltage levels is applied to inputs of the address buffers 14 by eight address input terminals 16. The X decoder 12 functions to select one of the 256 row lines as defined by an eight bit address on the input terminals 16; if the selected row line is in the half 10b of the cell array then a row of dummy cells 17 on the opposite side of the sense amplifiers 11 is also activated, while if a line in the half 10a is selected then a row of dummy cells 18 is activated. The address signals on the input lines 16 are multiplexed; the Y address is also applied to these input lines and is latched into a set of eight buffers 19, also using the input circuits according to the invention, from which the address is applied to column decoders 20, 21 and 22 via output circuits 23 and lines 24. A one-of-64 selection is made by the column decoders 20 and 21, so that one group of four columns is connected to sets of four data and data bar lines 25 and 26, based on six bits of the eight bit Y address. A one-of-four decoder 22 selects one pair of the four pairs of lines 25 and 26, based on two bits of the eight bit Y address, and connects the selected pair to a data I/O control circuit 27 via a pair of lines 28. A single bit data input is applied by an input terminal 30 to a data input latch 31, and the output of this latch is coupled to the data I/O control 27. The latch 31 may use the input arrangement having features according to the invention and is of the same circuit design as the address buffer circuits 14 and 19. One-bit data output is connected from the data I/O control 27 through a buffer 32 to a data out terminal 33.

The X address must appear on the inputs 16 when a row address strobe signal, referred to as $\overline{RAS}$, is applied to an input 34. Likewise, the Y address must appear during a column address strobe signal $\overline{CAS}$ on an input 35. Read/write control $\overline{W}$ on an input 36 is the other control signal for the device. A clock generator and control circuit 37 generates a large number of clocks and control signals to define the operation of various parts of the device. When $\overline{RAS}$ goes low as seen in FIG. 2a, clocks derived from $\overline{RAS}$ cause the buffers 14 to accept and latch the eight TTL level signals appearing on the input lines 16. When $\overline{CAS}$ goes low as seen in FIG. 2b then clocks generated in the circuitry 37 cause the buffers 19 to latch the TTL level Y address signals on the inputs 16. The row and column addresses must be valid during the time periods shown in FIG. 2c. For a read cycle, the $\overline{W}$ signal on input 36 must be high during the period seen in FIG. 2d, and the output on the terminal 33 will be valid during the time seen in FIG. 2e. For a write-only cycle, the $\overline{W}$ signal must be low as seen in FIG. 2f and the data-in bit must be valid during the time seen in FIG. 2g. The data out pin stays in a high impedence state during a write-only cycle. A read/write cycle is also possible.

The Cell Array and Sense Amplifiers

Figure 3:
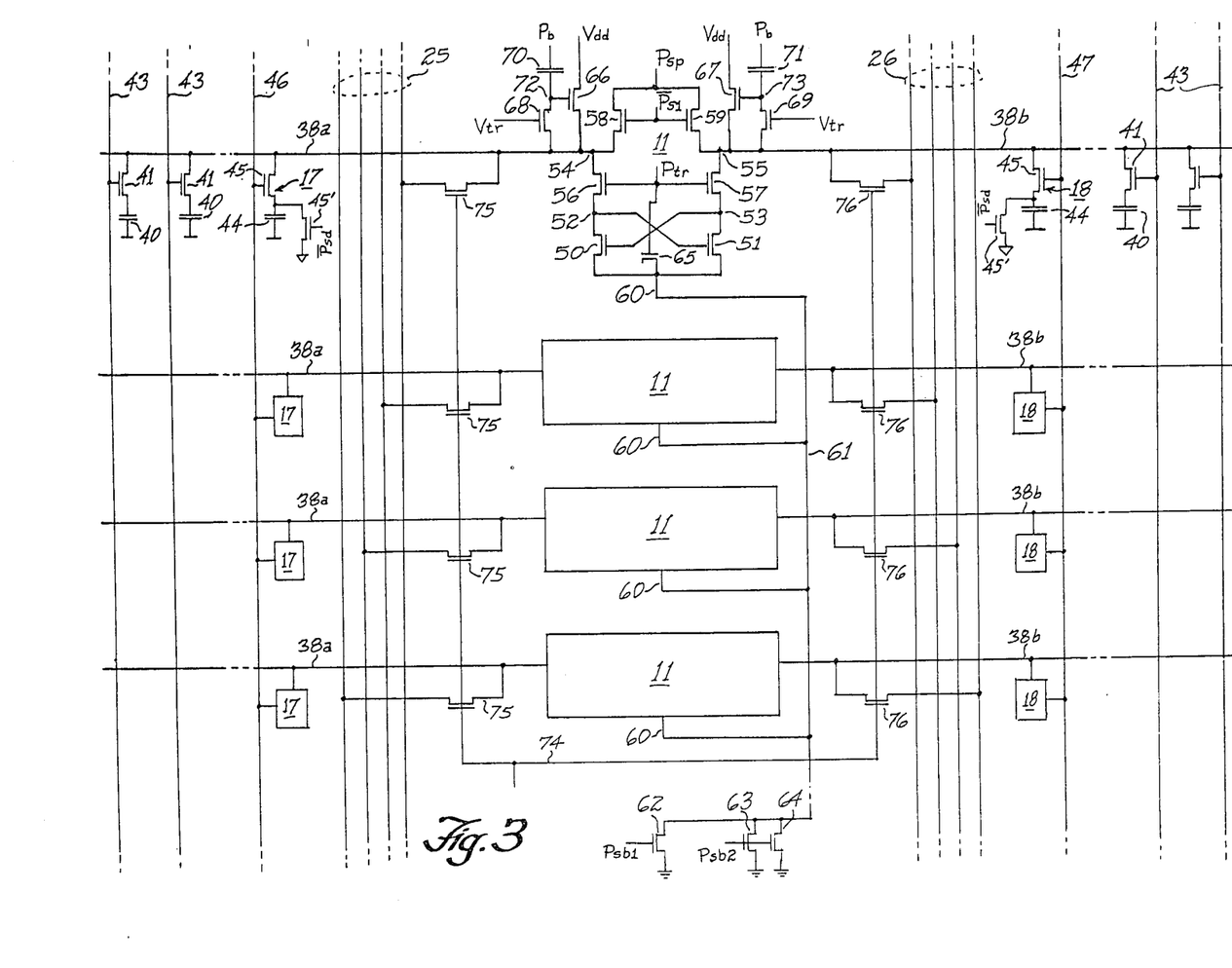
FIG. 3 is an electrical schematic diagram of the cell array in the device of FIG. 1.

In FIG. 3, a portion of the cell array is shown in schematic form. Four identical sense amplifiers 11 are positioned at the center of the array, connected to four column line halves 38a or 38b. Sixty-three other sets of four sense amplifiers and column lines are included in the array. Connected to each column line half 38a or 38b are 128 one-transistor cells each having a storage capacitor 40 and a transistor 41. The cells are of the type described in pending U.S. patent applications Ser. No. 648,594, filed Jan. 12, 1976 and Ser. No. 722,841, filed Sept. 13, 1976 by C-K Kuo, both assigned to Texas Instruments, or U.S. Pat. No. 4,012,757. Row lines 43 which are the outputs of the row decoders 12 are connected to the gates of all of the transistors 41 in each row; there are 256 identical row lines 43 in the array. Also connected to each column line half 38a or 38b is a dummy cell 17 or 18 which consists of a storage capacitor 44, an access transistor 45 and a grounding transistor 45'. The gates of all dummy cells in a row are connected to a line 46 or 47. When the X address selects one of the lines 43 on the left, the associated transistor 41 is turned on to connect the capacitor 40 for this selected cell to the column line half 38a, while at the same time the dummy cell select line 47 on the opposite side is activated, connecting the capacitor 44 in one of the cells 18 to the column line half 38b. The dummy cell capacitance 44 is about ½ that of the storage cell capacitance 40. The dummy cell is predischarged to a logic zero before every active cycle by 45'.

The sense amplifier consists of a bistable circuit having a pair of driver transistors 50 and 51, each with its gate connected to the drain 52 or 53 of the other to provide a cross-coupled flip-flop. The drains 52 and 53 are connected to nodes 54 and 55 at the ends of the lines 38a and 38b through the source-to-drain current paths of a pair of coupling transistors 56 and 57. The gates of the transistors 56 and 57 are both connected to a source of a clock voltage Ptr, seen in FIG. 4j. The nodes 54 and 55 and column line halves 38a and 38b are precharged through the source-to-drain current paths of a pair of transistors 58 and 59 connected to a voltage source Psp, shown in FIG. 4g. The gates of the transistors 58 and 59 are connected to a clock voltage $\overline{Psl}$ seen in FIG. 4h.

The sources of the driver transistors 50 and 51 are connected together at a node 60, and this node 60 is connected by a line 61 to the same node in all of the 256 sense amplifiers 11 in the array. The line 61 is connected to a transistor 62 and a dual channel transistor 63 and 64 which function as grounding paths. The gate of the transistor 62 is connected to a clock Psb1 seen in FIG. 4b, and the common gate of the dual transistors 63 and 64 is connected to a clock Psb2 seen in FIG. 4c. This grounding arrangement is similar to that of application Ser. No. 682,687, filed May 3, 1976, refiled June 30, 1978 as Ser. No. 920,755, assigned to Texas Instruments. The two current paths of the dual transistor 63 and 64 turn on at different times because the channel area of the transistor 64 is ion implanted to raise its threshold votage so that it turns on later than the transistor 63 even though the same clock is applied to its gate. The dual transistor 63 and 64 (actually one large transistor with difference channel implants) is much larger than the transistor 62, in channel width to length ratio. Alternatively, the channel width to length ratio of 64 would be larger than that of 63.

The column lines halves 38a and 38b along with nodes 54 and 55 are precharged to near Vdd during the precharge part of an operating cycle when both Psp and $\overline{Psl}$ are high. At this time Ptr is high so the nodes 52 and 53 are precharged also. The transistors 50 and 51 are off because the transistors 62-64 are all off, Psb1 and Psb2 being low. After $\overline{Psl}$ has gone low, turning off the transistors 58 and 59, and before Psb1 goes high, an X address reaches one of the lines 43 at the same time that the dummy cell address line 47 is activated. This causes an imbalance in the voltage on the nodes 54 and 55, and the same differential is coupled to the nodes 52 and 53 because the voltage Ptr is higher than Vdd. Then, when Psb1 goes high and the small transistor 62 turns on, the sensing operation is initiated and the nodes separate more as the bistable circuit including the transistors 50 and 51 goes toward a stable condition with one transistor conducting and the other cut off. A slight delay from Psb1, the clock Psb2 goes high to complete the sensing operation by latching the bistable circuit and obtaining a good one/zero set on opposing digit lines. By capacitor 65 along with the parasitic capacitances of the transistor 56 and 57, the voltage Ptr is dynamically level shifted from greater than Vdd down to Vdd; the drop in voltage on the node 60 toward Vss as PsB1 then Psb2 go high is coupled to the gates of the transistors 56 and 57.

An active pull-up circuit is employed in the sense amplifier to allow storage of a full Vdd level. This circuit comprises a pair of pull-up transistors 66 and 67 connecting the nodes 54 and 55 to Vdd, along with control transistors 68 and 69 connecting the gates of the transistors 66 and 67 to the nodes 54 and 55, and capacitors 70 and 71 connecting the gates to a boosting clock Pb occurring after Psb2. The gates of the transistors 68 and 69 are connected to a trap voltage Vtr which stays at a level of about 1 Vt below Vdd during the active part of the cycle then at Vdd during the precharge part.

After the sensing operation is essentially completed and Psb2 has come on to render first the low threshold transistor 63 then after a slight delay the higher threshold transistor 64 conductive, a definite logic one and logic zero are set up on the column lines 38a and 38b. Then, about four ns after Psb2 goes high, the selected X line 43 (but not the dummy cell select line) is slowly boosted to a level of Vdd+Vt to permit restoration of a full Vdd level in the capacitor 40 for the selected cell. At the same time the X line 43 is being boosted, the clock Pb goes high to activate the active load circuits. The clock Pb causes level shift at either node 72 or 73 via the gated capacitors 70 and 71. Only one of these nodes will have retained a logic one because the column lines will be near the one/zero set at this time; conduction through the transistors 68 or 69 for the zero-going side will discharge node 72 or 73 and cause the gated capacitor 70 or 71 to exhibit very little capacitance so Pb will not charge the node 72 or 73 for this side. The other node 72 or 73 which retained a one, at near Vdd, will be shifted to greater than Vdd thereby allowing this column line half to be pulled back up to Vdd through transistor 66 or 67. At the same time as Pb occurs, the clock Psp is pulled to Vss.

Selection of one group of four of the 256 column lines 38a and 38b by a Pyh voltage occurs a slight delay from when Psb2 goes high. The one-of-64 column decoder 20 and 21, physically located in the space between the sense amplifiers 11 and the data and data bar lines 25 and 26, produces only one Pyh signal on a line 74 to activate only one set of four transistors 75 coupling nodes 54 to lines 25 and one set of four transistors 76 coupling nodes 55 to lines 26. The remaining sixty-three sets of sense amplifiers 11, although operative for refresh on every read or write cycle, will not be coupled to the data and data bar lines because the Pyh signal on the line 74 will be low for these.

Figure 2:
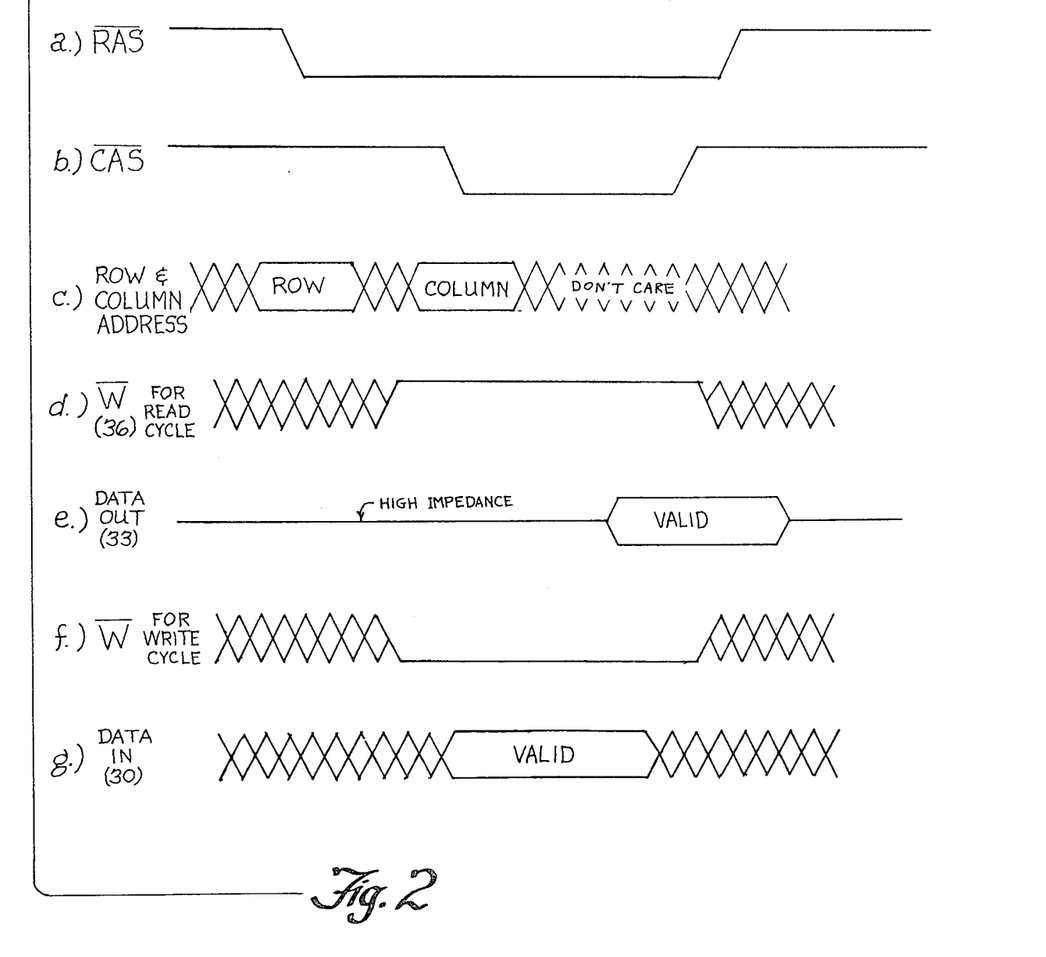
FIGS. 2a-2g are graphic representations of voltage vs time or other conditions vs time existing for various parts of the device of FIG. 1.
Figure 4:
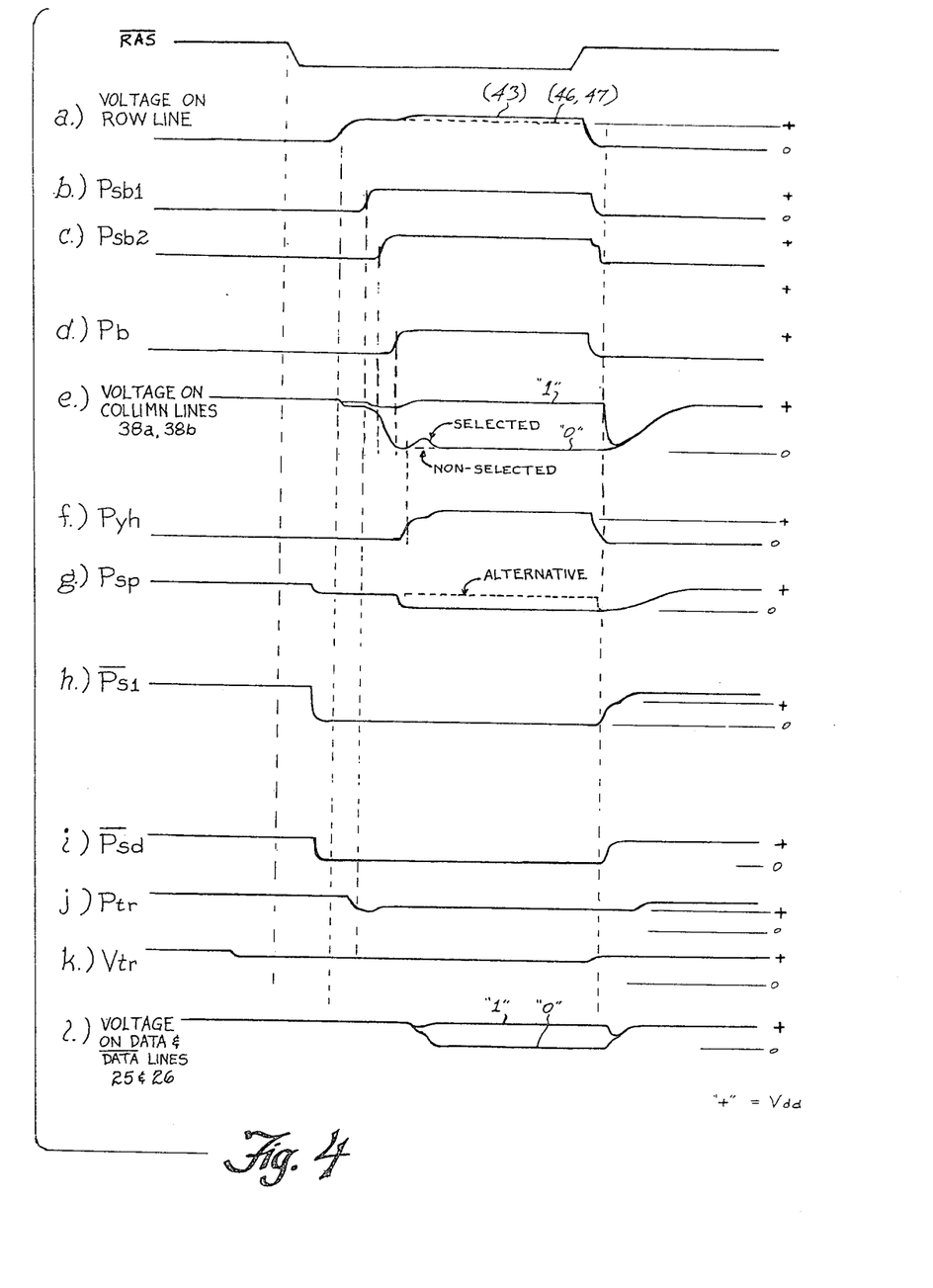
FIGS. 4a-4l are graphic representations of voltage vs time existing in various parts of the circuit of FIG. 3.
Figure 5:
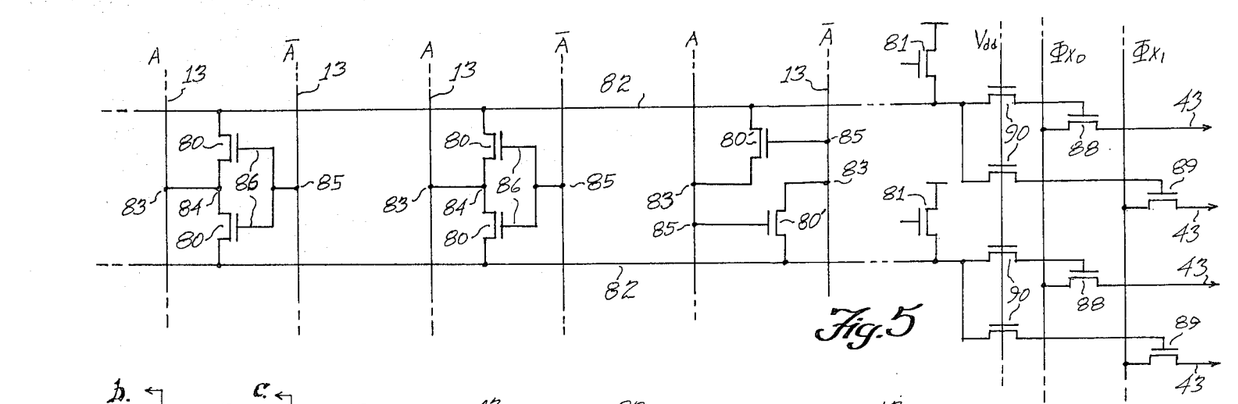
FIG. 5 is an electrical schematic diagram of a part of the device of FIG. 1 showing the circuit of the invention in detail.
Figure 6:
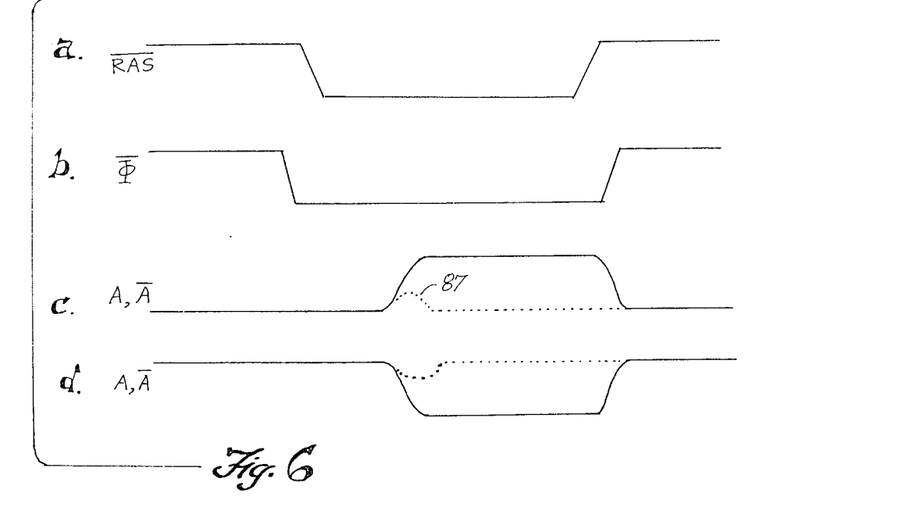
FIGS. 6a-6d are graphic representations of voltage vs time existing at various parts of the circuit of FIG. 5.

According to the invention, the row decoder 12 receives address and address bar inputs A0, $\overline{A0}$, A1, $\overline{A1}$, etc., from the row address buffers and latches 14, 15 by lines 13, and these are applied to source and gate of each input transistor 80 or vice versa to the gate and source as seen in FIG. 5. The transistors 80 are the input devices of NOR gates having precharge transistors 81 and output lines 82. The A, $\overline{A}$ lines 13 are connected at contacts 83 to the sources 84 of the input transistors 80 or at contacts 85 to the gates 86 of these input transistors. The points of connection of address and address bar determine whether the input is true or complement. During $\overline{RAS}$ as seen in FIG. 2 or 4, the node at the output line 82 is precharged via transistor 81 to Vdd; at this time the A and $\overline{A}$ lines 13 either both high or both low. After $\overline{RAS}$ goes low, the active portion of the cycle begins and A and $\overline{A}$ will be seen in FIG. 6d if originally both high, or as seen in FIG. 6c if originally both low. One will go high and the other low. During this active portion, a line 82 is discharged if the gate of any of the input transistors 80 is more than one Vt higher than its source, this being true whether the addresses start low and go high or start high and go low. The particular one of the 128 decoder lines 82 that is selected is the one in which the gates of the input transistors remain lower than the sources.

In the example of FIG. 6c where the A and $\overline{A}$ signals start low and one goes high, the one which is to stay low may have a positive-going bump 87 on it. In prior decoder circuits, this could cause a false discharge. In the present invention, however, since the discharge of the line 82 is accomplished by the separation of A and $\overline{A}$, it makes no difference if both rise several volts before splitting. For example, this would allow A to rise along with $\overline{A}$ to two volts and then fall back to Vss as A continues to rise toward Vdd.

Each of the NOR gate output lines of FIG. 5 is coupled to two of the row lines 43 via select transistors 88 or 89. The select transistors 88 have a voltage $\Phi X_o$ on their sources, while the select transistors 89 have a voltage $\Phi X_1$ on their sources. These voltages $\Phi X_o$ and $\Phi X_1$ correspond to that shown at FIG. 4a; only one occurs for a given row address, dependent upon the LSB of the row address, A0. That is, when A0 is 1, $\Phi X_o$ goes high and $\Phi X_1$ stays low, or when $\overline{A0}$ is 1, $\Phi X_1$ goes high and $\Phi X_o$ stays low. Thus, A0 is decoded by the select transistors 88, 89, while A1 to A7 are decoded in the NOR gates with input transistors 80. Isolating transistors 90 with Vdd on their gates are connected between the NOR gate outputs 82 and the gates of transistors 88 or 89. This arrangement allows the pitch of the output lines 82 to be twice that of the row lines 43, so the effective pitch of the decoder including the LSB select transistors 88, 89 is equal to that of the row lines.

Figure 7:
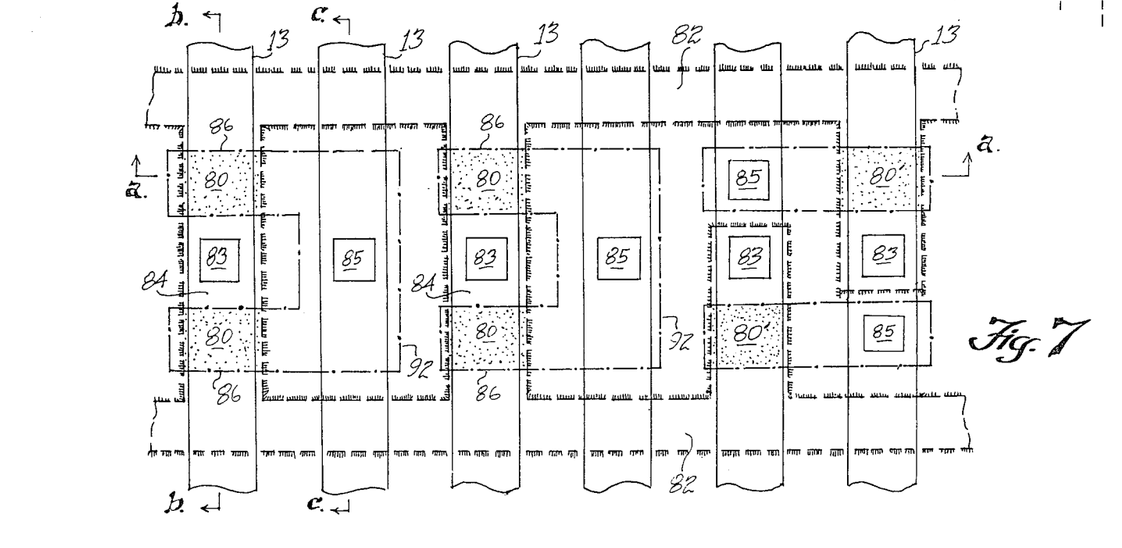
FIG. 7 is a plan view of a small part of a semiconductor device, greatly enlarged, containing the input circuit of the invention.
Figure 8:
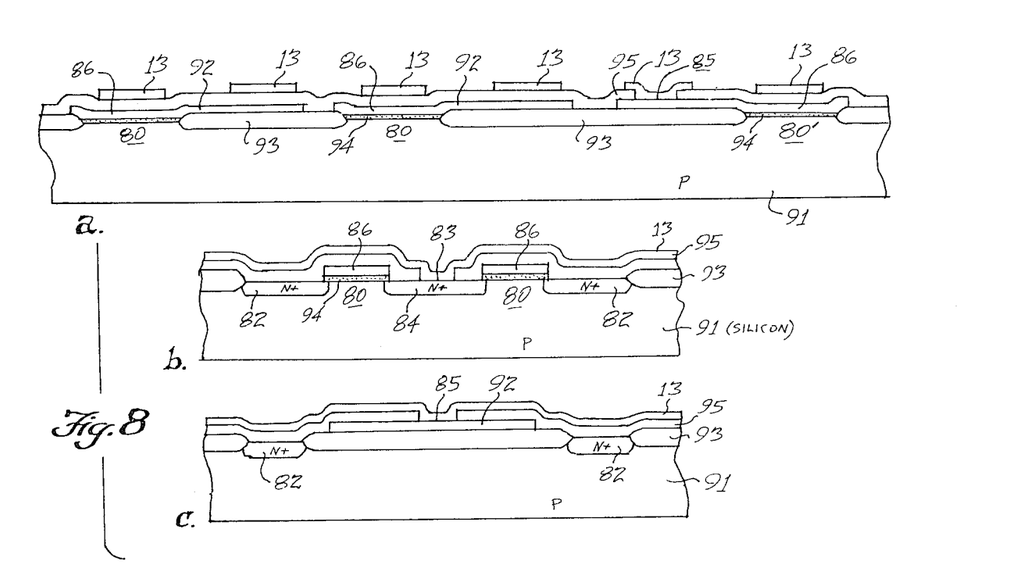
FIGS. 8a-8c are elevation views in section of the semiconductor device of FIG. 7, taken along the lines a—a, b—b and c—c, respectively.

A physical layout of the decoder of the invention is shown in FIG. 7 with sectional views in FIG. 8. The output lines 82 are N+ diffused moat regions in the face of a silicon chip 91. The address lines 13 are metal strips overlying the face. The gates 86 are parts of "C" shaped polysilicon segments 92, which are seen to be oriented facing left or right depending upon whether A or $\overline{A}$ is to make contact to the gates 86 for this particular bit. Metal to polysilicon contacts 85 connect to the segments 92 and thus to the gates 86, while metal-to-moat contacts 83 connect to the N+ source regions 84. It is noted that adjacent lines 82 are decoded the same, except for the LSB and next LSB of the row address. The bit next to the LSB is decoded by the transistors 80'. This arrangement permits a compact layout which would not be possible if the LSB and next LSB were included in the NOR gate with transistors 80. Chip 91 has thick field oxide 93 on all areas except the moat areas where transistors 80 or N+ regions are formed, and thin gate oxide 94 and interlevel oxide 95 are employed in the manner of standard N-Channel self-aligned silicon-gate processing.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. If is therefore contemplated that the appended claims will cover any such modifications or embodiments as fall within the true scope of the invention.

What is claimed is:

1. A semiconductor memory device comprising an array of memory cells on a semiconductor body, cells in the array being connected to one of a plurality of select lines, a plurality of pairs of identical NOR gates, each NOR gate pair aligned with an adjacent pair of said select lines and including a plurality of input transistors each having a gate and a source, address input means for the memory device producing a first plurality of address voltages and complements thereof for a first plurality of input address bits, the address voltages and complements being connected to said gates and said sources in a plurality of unique combinations for selection of one of the pairs of lines for a given combination of address, bits, and a second address bit produced by the address input means and connected to selection means, said selection means being connected to each of said adjacent pairs of select lines to activate only one of each pair.

2. A device according to claim 1 wherein the address input means includes a plurality of input buffers each separately receiving one address bit and producing an output address voltage and its complement.

3. A device according to claim 1 wherein the array is an array of rows and columns and the select lines are row lines.

4. A device according to claim 3 wherein the memory cells are one-transistor dynamic read/write memory cells.

5. A device according to claim 4 wherein the row lines are metal lines on a face of the semiconductor body.

6. A decoder device comprising a plurality of pairs of identical NOR elements in elongated rows with each NOR gate element including a plurality of input transistors in a row connected identical to the other NOR gate element of a pair, each transistor having a gate and a source, first address input means for the decoder device producing a plurality of address voltages and complements thereof for a plurality of input address bits, the address voltages and complements being connected to sources and gates in a plurality of different combinations for selection of one of the pairs of NOR gates for a given combination of address bits, and second address input means separate from the NOR gate for selecting between the pairs to activate only one output node for each pair.

7. A device according to claim 6 wherein the address input means includes a plurality of input buffers each separately receiving one address bit and producing an output address voltage and its complement.

8. A device according to claim 6 wherein two adjacent lines connected to the pairs of NOR gates are selected for a given one of said combinations.

9. A device according to claim 8 wherein each pair of adjacent lines are connected to a one-of-two select circuit in said address input means which receives an additional input address bit.

10. A device according to claim 4 wherein the connections to gate and source for address voltages for each pair of adjacent lines is identical.

* * * * *